(12) United States Patent
Camp

(10) Patent No.: US 10,615,778 B2
(45) Date of Patent: Apr. 7, 2020

(54) CREST FACTOR REDUCTION

(71) Applicant: Analog Devices, Inc., Norwood, MA (US)

(72) Inventor: James C. Camp, Oak Ridge, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/899,177

(22) Filed: Feb. 19, 2018

(65) Prior Publication Data

US 2019/0260358 A1 Aug. 22, 2019

(51) Int. Cl.
| H03F 1/32 | (2006.01) |
| H03F 3/24 | (2006.01) |
| H03H 17/02 | (2006.01) |
| H04L 27/26 | (2006.01) |

(52) U.S. Cl.
CPC ......... H03H 17/0273 (2013.01); H03F 1/32 (2013.01); H03F 3/24 (2013.01); H03H 17/0286 (2013.01); H04L 27/2614 (2013.01)

(58) Field of Classification Search
CPC ........ H04B 1/0475; H04B 2201/70706; H04L 27/2624; H04L 25/08; H04L 27/2623; H03F 2200/435; H03F 1/32; H03H 17/0273; H03H 17/0286
See application file for complete search history.

(56) References Cited

U.S. PATENT DOCUMENTS

| 4,852,035 | A * | 7/1989 | Michener | ........... H03H 17/0223 708/313 |
| 6,862,324 | B1 * | 3/2005 | Lui | ..................... H04L 27/2017 375/326 |
| 6,931,079 | B1 * | 8/2005 | Peeters | ............... H04L 27/2624 375/295 |
| 9,014,319 | B1 * | 4/2015 | Copeland | ............ H04L 27/2624 375/350 |
| 2006/0014500 | A1 * | 1/2006 | Marsili | ............... H04B 1/0475 455/115.1 |
| 2010/0195711 | A1 * | 8/2010 | Hasan | ............... H04L 25/03159 375/233 |

(Continued)

OTHER PUBLICATIONS

"An Introduction to Digital Filters", Intersil Corporation, (Jan. 1999), 10 pgs.
"Introduction to Multirate", MUS420/EE367A, (2000), 1-22.

*Primary Examiner* — Aristocratis Fotakis
(74) *Attorney, Agent, or Firm* — Schwegman Lundberg & Woessner, P.A.

(57) ABSTRACT

A crest factor reduction (CRF) circuit may include a scaler configured to receive the input signal and generate a scaled input signal. A clipping circuit may be configured to receive the input signal and generate a clipped input signal. A negator circuit may be configured to receive the clipped input signal and generate a negated clipped input signal. A first summer may be configured to sum the scaled input signal and the negated clipped input signal to generate a summed signal. A first digital filter may be configured to receive the summed signal and provide a first digital filter output. A second digital filter may be configured to receive the clipped input signal and provide a second digital filter output. A multiplexer may be configured to receive the first digital filter output and the second digital filter output and generate an output signal.

18 Claims, 11 Drawing Sheets

(56) References Cited

U.S. PATENT DOCUMENTS

| | | | |
|---|---|---|---|
| 2010/0202506 A1* | 8/2010 | Bulzacchelli | H04L 25/03057 375/233 |
| 2011/0182339 A1* | 7/2011 | Kang | H04L 27/2624 375/224 |
| 2014/0169496 A1 | 6/2014 | Yang et al. | |
| 2014/0269987 A1* | 9/2014 | Gubeskys | H04L 27/2624 375/296 |
| 2014/0341316 A1* | 11/2014 | Yu | H04L 27/2624 375/296 |
| 2016/0028574 A1* | 1/2016 | Wang | H04L 27/367 375/296 |
| 2017/0187561 A1* | 6/2017 | Kwon | H04L 27/2623 |
| 2017/0302490 A1* | 10/2017 | Qiu | H04L 27/2623 |
| 2017/0331650 A1* | 11/2017 | Martinez | H04L 25/03828 |

* cited by examiner

CREST FACTOR REDUCTION

FIELD OF THE DISCLOSURE

This document pertains generally, but not by way of limitation, to integrated circuits and, and particularly, but not by way of limitation, to integrated circuits and methods for crest factor reduction.

BACKGROUND

Electrical signals can sometimes include peaks that can be multiples of the average signal value. For example, when multiple channels are synthesized, constructive interference between channels will sometimes generate large peaks. A signal with excessive or excessively large peaks can present significant challenges in circuit design. For example, if an amplifier or other circuit component lacks sufficient head room to handle the peaks linearly, it will clip and distort the signal. Peaks in an electrical signal are described by the signal's crest factor, which is a ratio of the signal's peak value over the signal's root mean square (RMS) value. Crest Factor Reduction (CFR) is used to reduce or eliminate signal peaks, thereby easing the design considerations for other circuit components.

SUMMARY OF THE DISCLOSURE

A digital CFR arrangement is generated using a polyphase digital filter. The polyphase digital filter comprises a first digital filter and a second digital filter. An output of the first digital filter and an output of the second digital filter are provided to a multiplexer. The multiplexer generates an output signal by alternating between samples from the output of the first digital filter and samples from the second digital filter. In this way, the output signal interleaves the outputs of the first and second digital filters. For example, even samples of the output signal may be taken from the output of the first digital filter and odd samples of the output signal may be taken from the output of the second digital filter.

Various clipping, inverting, scaling, and summing are optionally added at the inputs of the first and second digital filters to introduce CFR. A clipping circuit clips an input signal to generate a clipped input signal. The clipped input signal is provided to a second digital filter input. A scaling circuit multiplies samples of the input signal by two to generate a scaled input signal. An inverting circuit inverts the clipped input signal to generate a negated clipped input signal. A summing circuit generates a summed signal from the negated clipped signal and the scaled signal. The summed signal is provided to a first digital filter input.

BRIEF DESCRIPTION OF THE DRAWINGS

In the drawings, which are not necessarily drawn to scale, like numerals may describe similar components in different views. The drawings illustrate generally, by way of example, but not by way of limitation, various embodiments discussed in the present document.

DETAILED DESCRIPTION

CFR circuits and methods (generally referred to as a CFR) balance complexity and cost with performance, where the performance a CFR may be measured by the amount of distortion that it causes to an input signal, such as error vector magnitude (EVM). Relatively high performance CFR, e.g., with relatively low EVM, is available, although typically at a high cost. Some CFR techniques, such as simple clip-and-filter techniques, can be implemented at lower cost and complexity, however, performance for these techniques is typically lower (e.g., EVM is typically higher). The examples described herein are directed to CFR circuits and methods that balance low cost and complexity with increased performance. In some examples, a diplex CFR arrangement is implemented by adding a small number of components and/or operations to circuits that implement digital filters.

Figure 1:
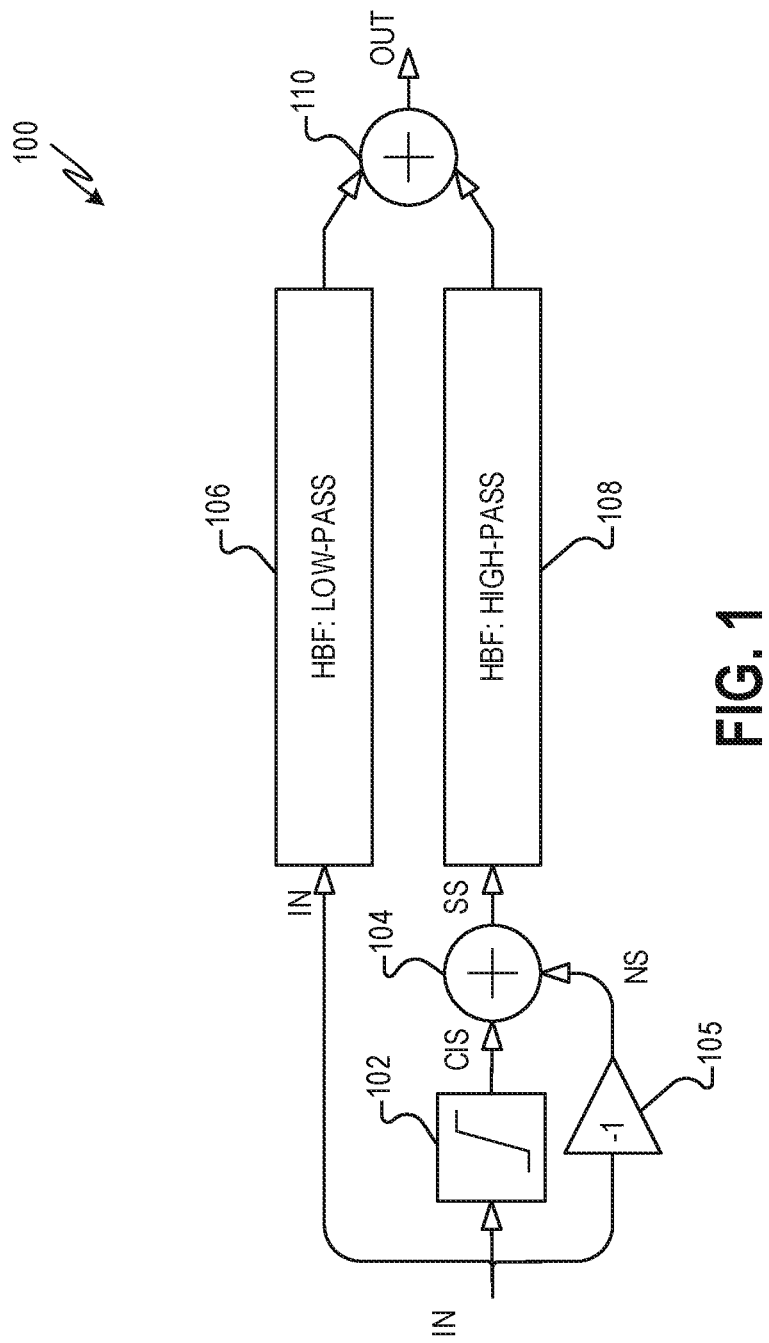
FIG. 1 is a diagram showing one example of a circuit for implementing CFR.

FIG. 1 is a diagram showing one example of a diplex CFR arrangement 100. The diplex CFR arrangement 100 implements a peak cancellation CFR technique. The diplex CFR arrangement 100 receives a digital input signal (IN). The input signal is provided to a clipping circuit 102 that clips peaks from the input signal to generate a clipped input signal (CIS). The clipping circuit 102 may be hard-limited or soft-limited, real or complex, Cartesian or polar and, in some examples, may be time invariant or not time-invariant. In some examples, the clipping circuit 102 is limited to about 13 dB above the input signal mean.

The input signal is also provided to a negator circuit 105 that generates a negated signal (NS) that is an inverse of the input signal. A summer circuit 104 receives the clipped input signal and the negated signal and generates a sum signal (SS). The sum signal is effectively the input signal minus the clipped input signal. The sum signal is provided to a half band, high-pass digital filter 108. The filter 108 may be of any suitable type of digital filter including, for example, an infinite impulse response (IIR) filter, a finite impulse response (FIR) filter, etc., and may have any suitable number or taps and any suitable cut-off frequency. In some examples, the filter 108 is an interpolating filter, where the output of the filter 108 has a sample rate greater than the input of the filter 108, for example, by a factor of two. The output of the filter 108 may be or include a set of cancellation pulses that, when added to the input signal, or a low-pass filtered version of the input signal, reduce the crest factor at the output.

The input signal is also provided to a half band, low-pass digital filter 106. The filter 106 may be any suitable type of digital filter including, for example, an infinite impulse response (IIR) filter, a finite impulse response (FIR) filter, etc., and may have any suitable number or taps and any suitable cut-off frequency. In some examples, the filters 106, 108 are complimentary, each covering half of the band of the input signal. For example, the low-pass filter 106 and the high-pass filter 108 may have the same or a similar cut-off frequency. The outputs of the respective filters 106, 108 are summed at a summer 110 to generate an output signal (OUT). Summing at the summer 110 may apply the set of cancellation pulses generated at the output of the high-pass filter 108 to the low-pass filtered input signal (e.g., the output of the low-pass filter 106) to implement crest factor reduction. The filters 106, 108 may be polyphaser filters where the output signal (OUT) has a different, for example, higher sampling rate than the input signal (IN). In some examples, one or more of the filters, such as the high-pass filter 108, are implemented as a delay, as described in more detail herein.

A z-transform description of the diplex CFR arrangement 100 is given by Equation [1] below:

$$\text{OUT}(z) = \text{IN}(z^2) \cdot H_{LPF}(z) + [\text{CIS}(z^2) + \text{NS}(z^2)] \cdot H_{HPF}(z) \quad [1]$$

The output signal is given by OUT(z), while the input signal is given as $\text{IN}(z^2)$. In various examples, the sample rate of the output signal is double the sample rate of the input signal. This is indicated in Equation [1] in that the input signal is a function of $z^2$, while the output is a function of z. $H_{LPF}(z)$ is the transfer function of the low-pass filter 106. The low-pass filter 106, in the example of Equation [1], is an interpolating filter that doubles the sample rate of the input. Hence, while the input signal is a function of $z^2$, the output of the low-pass filter 106 is a function of z. The output of the clipping circuit 102, given by $\text{CIS}(z^2)$. The difference of the output of the clipping circuit 102 and the input signal effected by the negator circuit 105 and summer circuit 104 is represented by the summed signal (SS). The high-pass filter 108 is represented by its transfer function $H_{HPF}(z)$, wherein the input response is a function of z. The summer 110 is represented by the summing the addition of the output of the low past filter 106 [$\text{IN}(z^2) \cdot H_{LPF}(z)$] and the output of the high-pass filter 108 [[$\text{CIS}(z^2) - \text{IN}(z^2)$]·$H_{HPF}(z)$].

The diplex CFR arrangement 100 implements a peak cancellation CFR technique. The clipping circuit 102 clips peaks from the input signal. The clipped input signal, then, may be equivalent to the input signal with peaks (if any) clipped. Subtracting the input signal from the clipped input signal generates cancellation pulses in the summed signal. The high-pass filter 108 removes lower frequency components of the summed signal, resulting in a set of cancellation pulses. The set of cancellation pulses are added to the low-pass filtered input signal, received from the low-pass filter 106, to generate the output signal with a reduced crest factor. In some examples, the diplex CFR arrangement 100, by utilizing a peak cancellation CFR technique, tends to push distortion and noise caused by the CFR out of the band of the input signal. This may be useful, for example, in applications where there is no other signal in the adjacent bands that can be distorted or interfered with by the cancellation pulses. For example, the diplex CFR arrangements described herein may be useful in wired cable implementations where the entity sending the signal may use of the entire medium.

The diplex CFR arrangement 100 may be implemented in any suitable combination of hardware and software. For example, the various circuits described herein may be implemented as hardware, software, or mixed hardware and software. In some examples, the diplex CFR arrangement 100 is implemented entirely in software executed in one or more digital signal processors (DSPs) or other suitable processors. In other examples, some or all of the components of the diplex CFR arrangement 100 are implemented with dedicated components formed on a silicon or another type of semiconductor chip. Also, some or all of the components of the diplex CFR arrangement 100 may be implemented in one or more application specific integrated circuits (ASICs) or one or more field programmable gate arrays (FPGAs).

Figure 2:
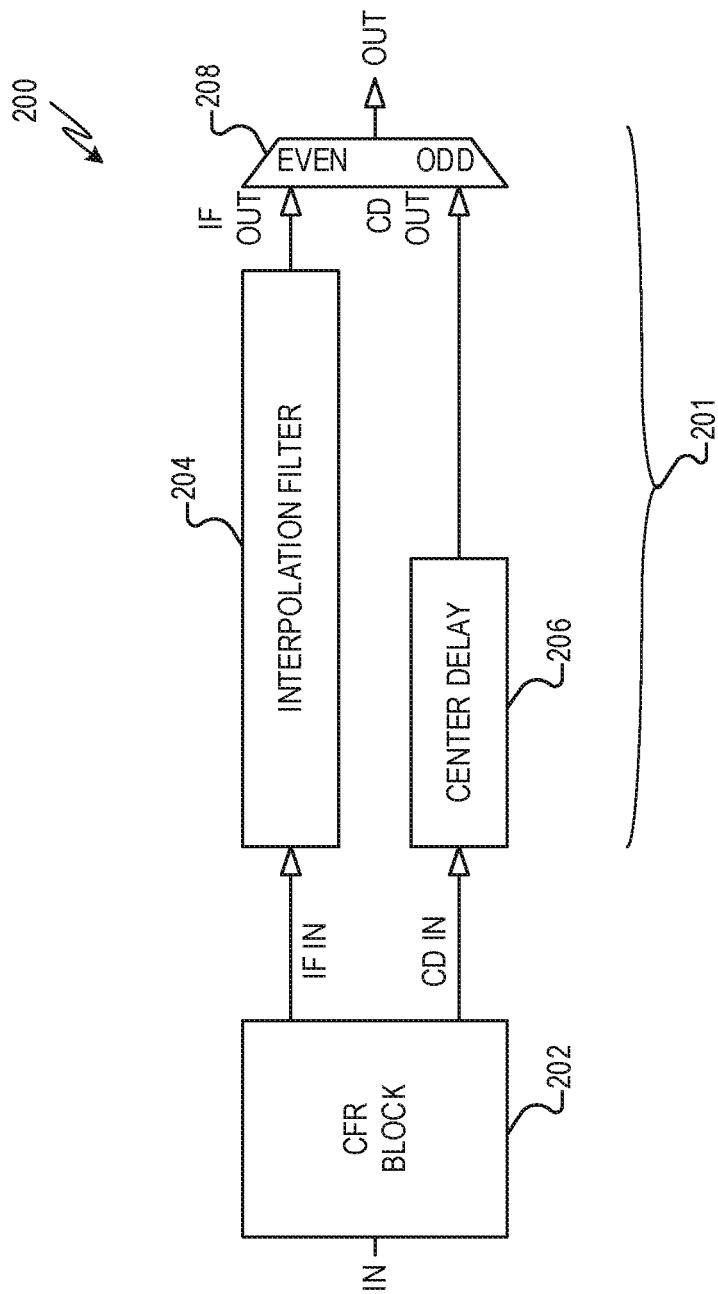
FIG. 2 shows a diplex CFR arrangement implemented by with a CFR circuit and a low-pass half-band filter (HBF).

In some examples, an equivalent to the diplex CFR arrangement 100 is generated by modifying a low-pass half-band filter (HBF). For example, FIG. 2 shows a diplex CFR arrangement 200 implemented by with a CFR circuit 202 and a low-pass HBF 201. The CFR circuit 202 receives an input signal (IN) and provides an interpolation filter input (IF IN) to an interpolation filter 204 of the low-pass HBF 201 and a center delay input (CD IN) to a center delay 206 of the low-pass HBF 201. The output of the interpolation filter 204 (IF OUT) and the output of the center delay (CD OUT) are combined at the multiplexer 208 to form an output signal (OUT). Note that in FIG. 1, the outputs of the respective filters are summed at the summer 110. In different implementations, the outputs of the diplexed filters can be combined using different combiner circuits or operations including summers, multiplexers, etc. Even samples of the output signal may be taken from the output of the interpolation filter and odd samples of the output signal may be taken from the output of the center delay. The arrangement of FIG. 2 shows just one example of how CFR may be implemented. For example, in some arrangements, the interpolation filter 204 and/or center delay filter 206 may be replaced with filters of other types and complexities.

In some examples, the CFR circuit 202 may be disabled. For example, the input signal may be provided to the input of the interpolation filter 204 and to the input of the center delay 206. In this configuration, the arrangement 200 may act as a low-pass HBF. For example, with the CFR circuit 202 disabled, the behavior of the arrangement 200 is described by Equation [2] below:

$$\text{OUT}(z) = \text{IN}(z^2) \cdot \left[ H_{even}(z^2) + H_{odd}(z^2) \cdot \frac{1}{z} \right] \quad [2]$$

In Equation [2], OUT(z) is the transfer function of the low-pass HBF 201. $\text{IN}(z^2)$ is the input signal. $H_{even}(z^2)$ is the transfer function of the interpolation filter 204. The term $H_{odd}(z^2) \cdot 1/z$ the transfer function of the center delay 206. Note that the input signal, and the transfer functions of the interpolation filter 204 and center delay 206 are functions of $z^2$, indicating a sample rate that is one half of the sample rate of the output signal.

Figure 3:
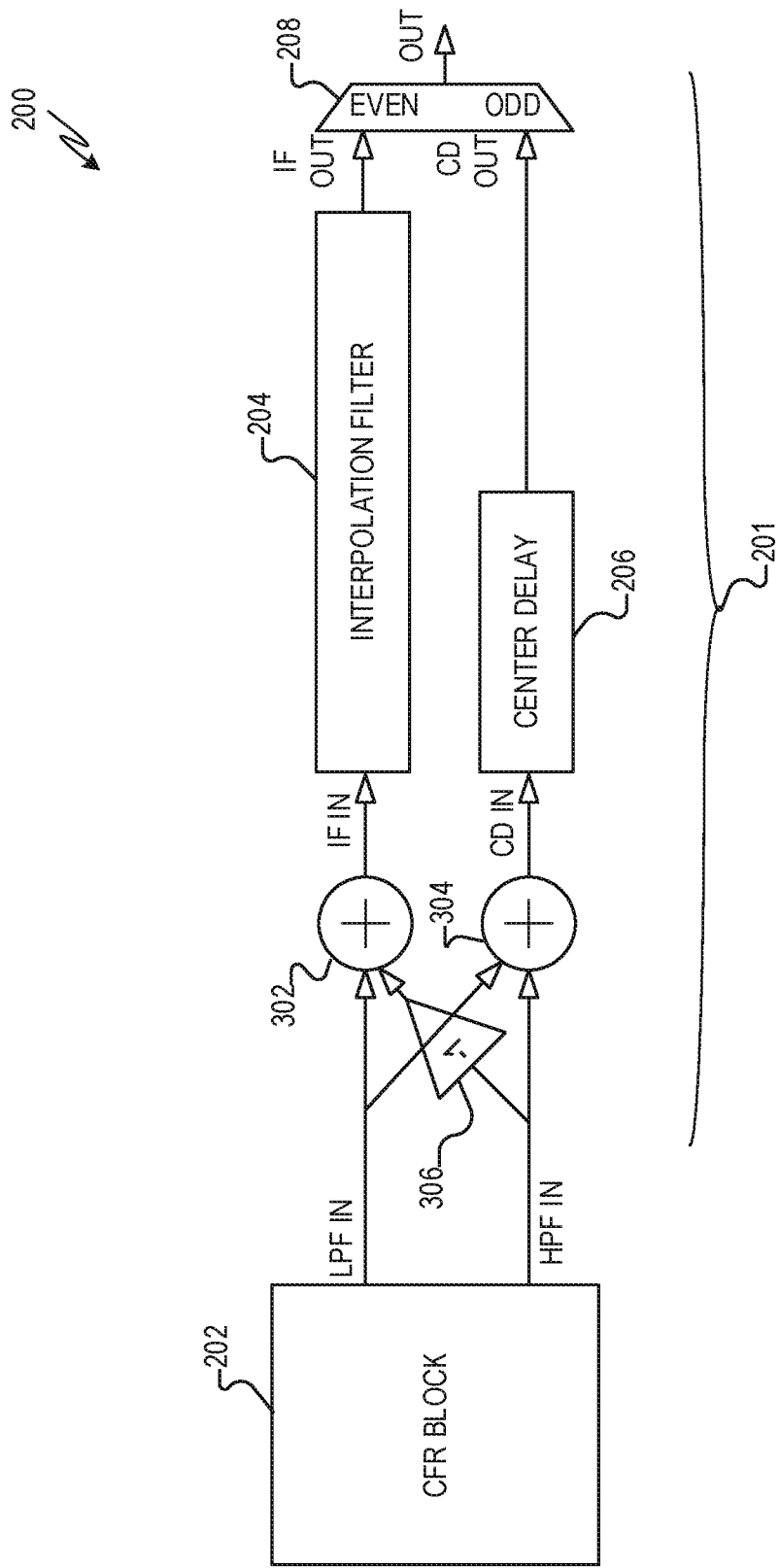
FIG. 3 is another example of the diplex CFR arrangement showing additional components.

FIG. 3 is another example of the diplex CFR arrangement 200 showing additional components. In FIG. 3, a negator circuit 306 and two summers 302, 304 are shown between the CFR circuit 202 and the filters 204, 206. In the example of FIG. 3, the CFR circuit 202 generates two inputs, a low-pass filter input (LPF IN) and a high-pass filter input (HPF IN), for example, as described herein. For example, the CFR circuit 202 may include a clipping circuit 102, summer circuit 104, and negator circuit 105 as shown in FIG. 1. The behavior of the diplex CFR arrangement 200 as shown in FIG. 3 is described by Equation [3] below:

$$OUT(z) = [IN_{LPF}(z^2) - IN_{HPF}(z^2)] \cdot \qquad [3]$$
$$H_{even}(z^2) + [IN_{LPF}(z^2) + IN_{HPF}(z^2)] \cdot H_{odd}(z^2) \cdot \frac{1}{z}$$

Figure 4:
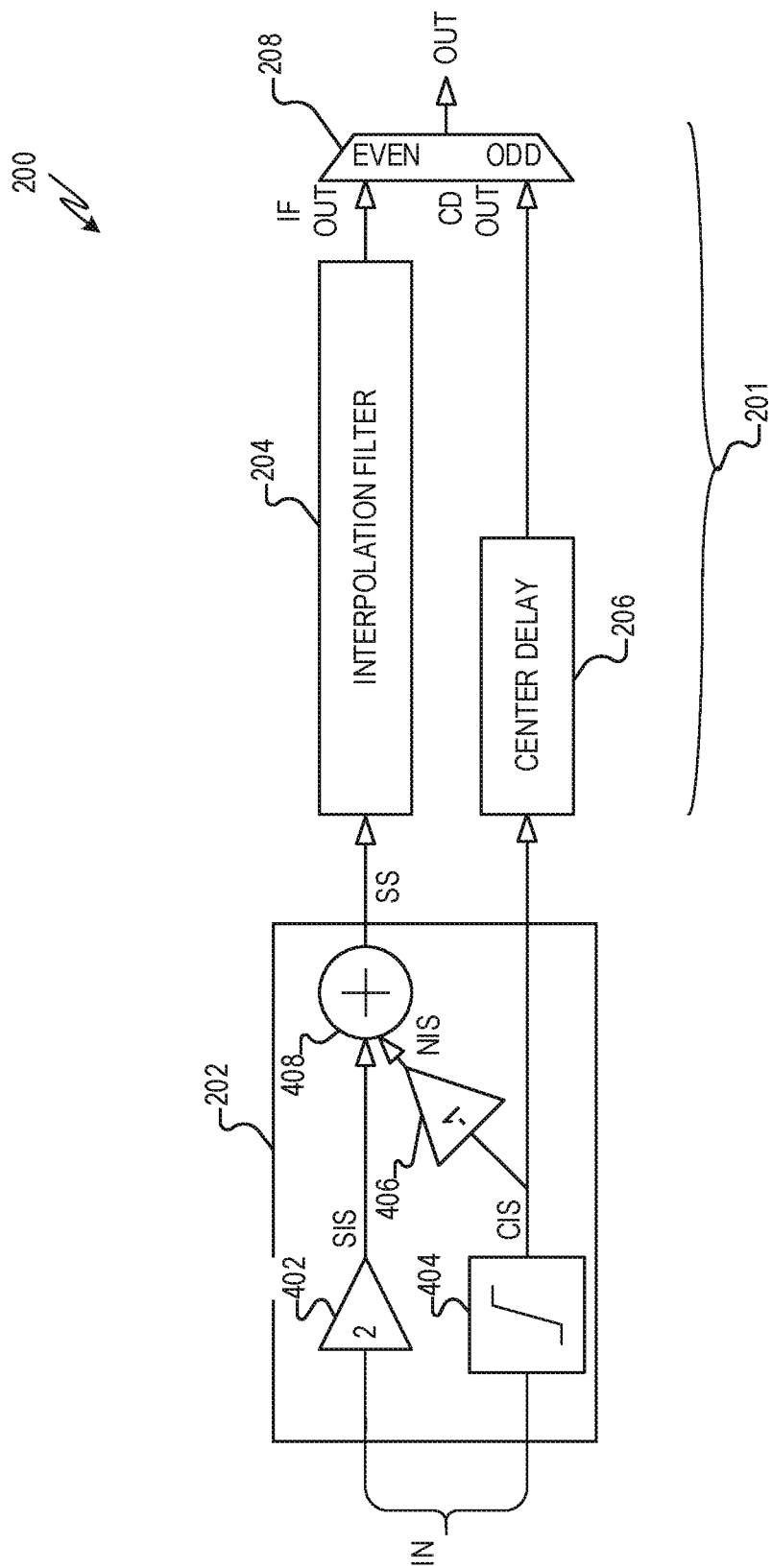
FIG. 4 is yet another example of the diplex CFR arrangement showing another example configuration of the CFR circuit.

FIG. 4 is yet another example of the diplex CFR arrangement 200 showing another example configuration of the CFR circuit 200. In the example configuration shown in FIG. 4, a single input signal (IN) is provided to a scaler circuit 402. The scaler circuit 402 scales the input signal by a scaling factor of two to generate a scaled input signal (SIS). A clipping circuit 404 also receives the input signal and generates a clipped input signal (CIS). The clipping circuit 404 may be a hard-limited or soft-limited clipping circuit and may or may not be time-invariant. A negator circuit 406 receives the clipped input signal and generates a negated clipped input signal (NIS). A summer circuit 408 sums the negated clipped input signal and the scaled input signal to generate a summed signal (SS). The interpolation filter 204 receives the summed signal while the center delay 206 receives the clipped input signal.

Like the diplex CFR arrangement 100, the diplex CFR arrangement 200 shown in FIGS. 2, 3, and 4 may be implemented in any suitable combination of hardware and software. For example, the various circuits described herein may be implemented as hardware, software, or mixed hardware and software. In some examples, the diplex CFR arrangement 200 is implemented entirely in software executed in one or more digital signal processors (DSPs) or other suitable processors. In other examples, some or all the components of the diplex CFR arrangement 200 are implemented with dedicated components formed on a silicon or another type of semiconductor chip. Also, some or all the components of the diplex CFR arrangement 200 may be implemented in one or more ASICs or one or more FPGAs.

The behavior of the diplex CFR arrangement 200 in the example of FIG. 4 may be described by modifying Equation [3] above. For example, in the arrangement of FIG. 4, the low-pass filter input from the arrangement of FIG. 3 is replaced with the input signal, $IN(z^2)$. The high-pass filter input from the arrangement of FIG. 3 is replaced with the clipped input signal, $[CIS(z^2)-IN(z^2)]$. Making these substitutions into Equation [3] yields Equation [4] below:

$$OUT(z) = [IN(z^2) - (CIS(z^2) - IN(z^2))] \cdot \qquad [4]$$
$$H_{even}(z^2) + [IN(z^2) + (CIS(z^2) - IN(z^2))] \cdot H_{odd}(z^2) \cdot \frac{1}{z}$$

Equation [4] may be reduced to the form shown in Equation [5] below:

$$OUT(z) = [2IN(z^2) - CIS(z^2)] \cdot H_{even}(z^2) + CIS(z^2) \cdot H_{odd}(z^2) \cdot \frac{1}{z} \qquad [5]$$

Equation [5] is equivalent to Equation [1] above. This indicates that the arrangement of the CFR circuit 202 shown in FIG. 4, along with the low-pass HBF 201, operates in a manner equivalent to that of the diplex CFR arrangement 100 of FIG. 1. Accordingly, in some examples, the diplex CFR arrangement 100 can be implemented by adding the CFR circuit 202 to the low-pass HBF 201. In various examples, this can lead to advantageous applications. For example, low-pass HBFs, such as the low-pass HBF 201, are commonly implemented in various products, such as Digital to Analog Converters (DACs).

In some examples the interpolation filter 204, represented by $H_{even}(z^2)$, and the center delay 206, represented by $H_{odd}(z^2)$, may be replaced by any suitable digital filter. For example, the interpolation filter 204 may be replaced by any suitable finite impulse response (FIR) or infinite impulse response (IIR) filter. Similarly, the center delay 206 may be replaced with any other suitable FIR or IIR filter. In various examples, the center delay 206 is implemented with a delay, for example, represented as $z^{-2 \cdot N}$.

Figure 5:
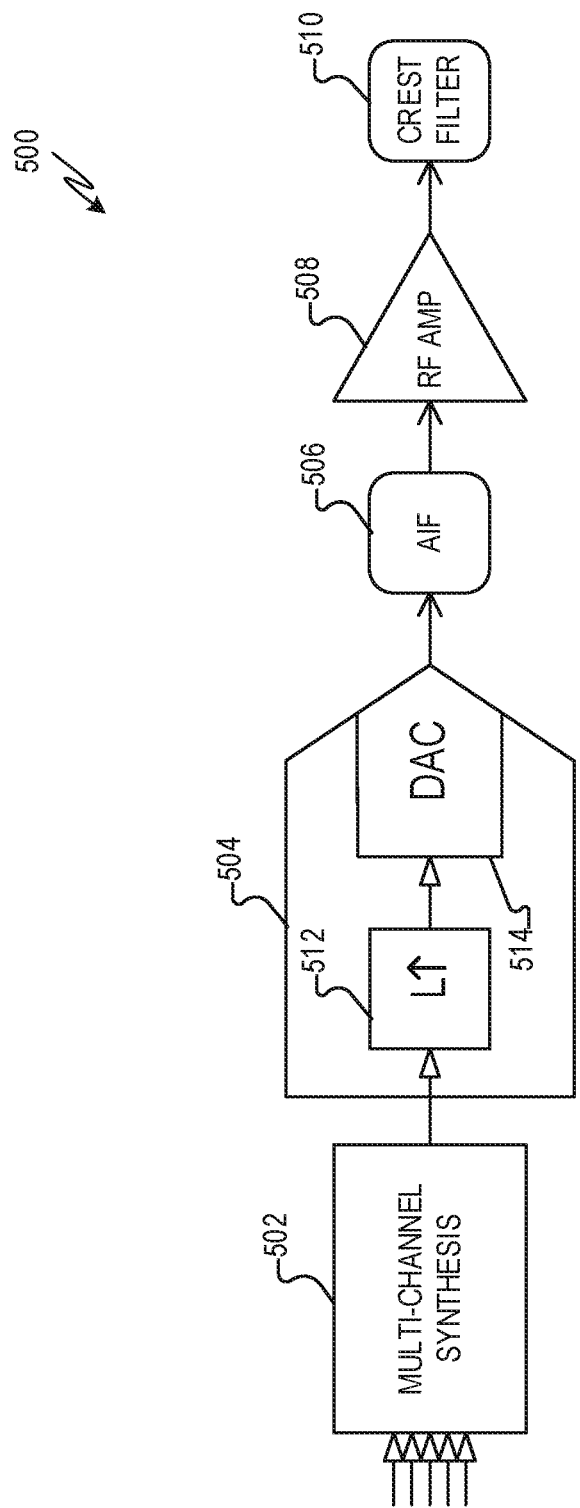
FIG. 5 is a diagram showing one example of a circuit including a DAC circuit that may implement CFR as described herein.

FIG. 5 is a diagram showing one example of a circuit 500 including a DAC circuit 504 that may implement a diplex CFR arrangement as described herein. The circuit 500 includes a multi-channel synthesis circuit 502 that receives multiple input signals and generates a synthesized input signal that is a combination of the multiple input signals. For example, each individual input signal may represent a communication channel for a wireless transmission, a channel for a wired, cable transmission, etc. The synthesized signal is provided to the DAC circuit 504. As shown, the DAC circuit 504 includes an interpolator circuit 512. The interpolator block 512, in various examples, includes any polyphase up-sampling filter, such as the low-pass HBF 201 and/or a cascade of filters such as the low-pass HBF 201. The DAC circuit 504 also includes a DAC 514 that converts the output of the interpolator block 512 to analog. An optional analog filter 506 is included prior to an analog (e.g., radio frequency) amplifier 508. An optional crest filter 510 may be a low-pass filter to filter noise from CFR clipping and/or regrowth.

In various examples, the interpolator block 512 is also modified to include a CFR block 202, as described herein. Including the components of the CFR block 202 may not introduce excessive complexity to the circuit. For example, the scaler block 402 may be implemented by shifting the input signal, for example, with a processor and/or register. In some examples, interpolation filters included in the interpolator block 512 already include a clipping block 404. Also, in some examples, some or all of the CFR block 202 may be capable of being activated or deactivated, depending on how the DAC circuit 504 and/or interpolator block 512 are configured. In this way, a designer may choose to activate the CFR block 202 to implement a diplex CFR with an HBF, such as the low-pass HBF 201 when it is desirable to do so in the context of an overall design.

Figure 6:
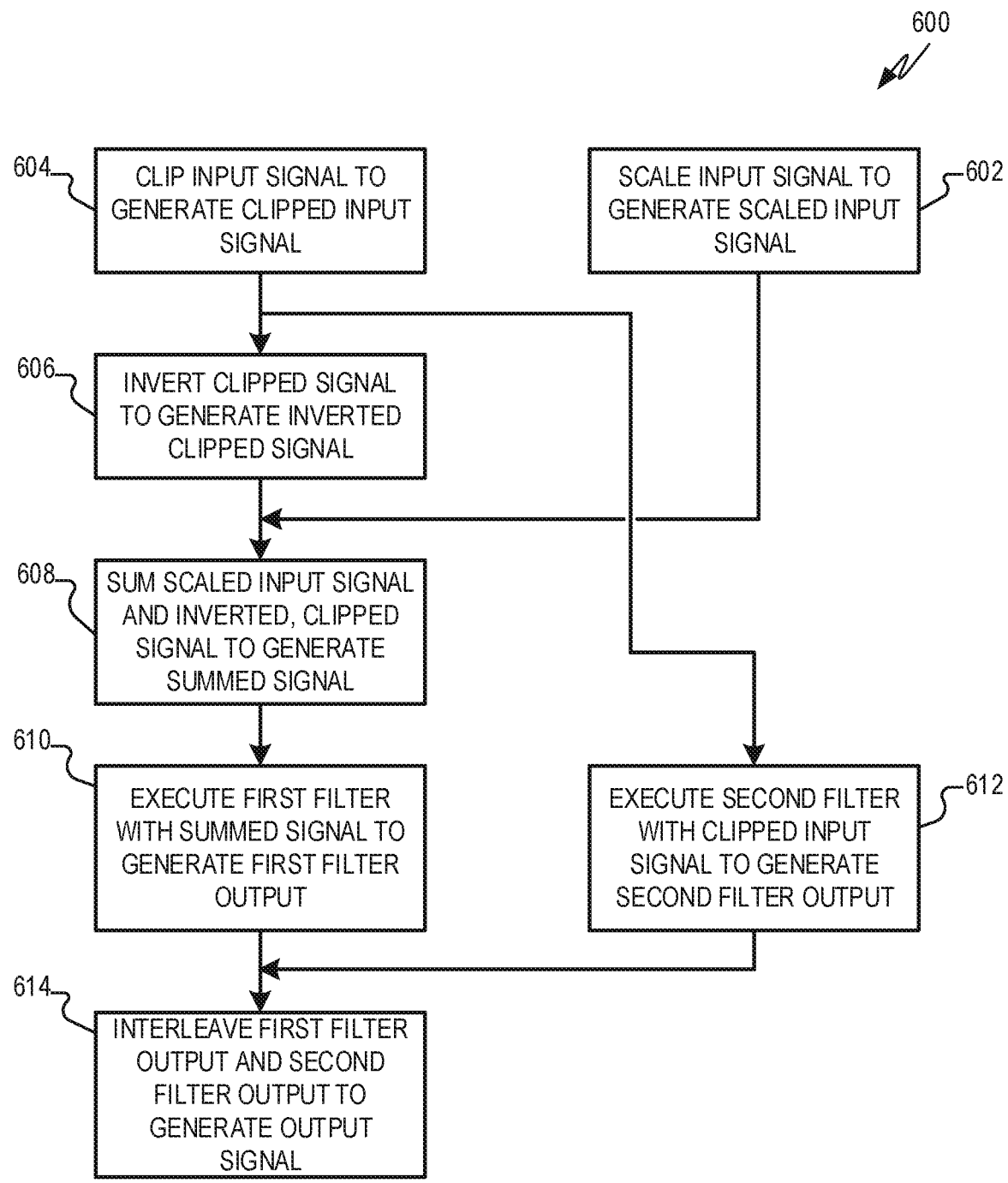
FIG. 6 is a flow chart showing one example of a process flow that may be executed to implement a diplex CFR arrangement.

FIG. 6 is a flow chart showing one example of a process flow 600 that may be executed to implement a diplex CFR arrangement. The process flow 600 may be executed with any suitable combination of hardware or software. For example, the process flow 600 may be implemented entirely in software executed in one or more digital signal processors (DSPs) or other suitable processors. In other examples, some or all of the process flow 600 is implemented with dedicated components formed on a silicon or another type of semiconductor chip. Also, some or all of the process flow 600 may be implemented in one or more ASICs or one or more FPGAs.

At operation 602, an input signal is scaled to generate a scaled input signal. At operation 604, the input signal is clipped to generate a clipped input signal. At operation 606, the clipped signal is negated to generate a negated, clipped signal. Operations 602, 604, 606 may be executed sequentially or, in some examples, operation 604 and/or operation 606 may be executed in parallel with operation 602. At operation 608, the scaled input signal is summed with the negated, clipped input signal to generate a summed signal.

At operation 610, a first filter is executed, for example on the summed signal, to generate a first filter output. At operation 612, a second filter is executed, for example, on the clipped input, to generate a second filter output. Operations 610 and 612 may be executed sequentially and/or in parallel. At operation 614, the first filter output and second filter output are interleaved to generate an output signal.

In various examples, the diplex CFR arrangements described herein may be advantageously implemented at low cost, for example, by utilizing portions of digital filters, such as low-pass HBFs, that are already incorporated into components such as DACs. Diplex CFR arrangements described herein, however, may provide better performance than other low cost CFR techniques, such as clip-and-filter techniques. To demonstrate this, a model was generated. The model utilized an input signal that included a real, unfiltered normal distribution of sample values with 1,048,576 samples in total. The samples were scaled so that some of the samples are larger than full scale, thus simulating out-of-scale peaks of a signal to which CFR may be applied. (Samples larger than full scale may be samples having a value that, when converted to analog, is outside of the linear range of one or more amplifiers used in a transmitter or other circuit utilizing CFR.) The input signal included about 8 samples to peak more than 13 dB above the average, as shown in Equation [6] below:

$$1024^2 erfc\left(\frac{10^{\left(\frac{13}{20}\right)}}{\sqrt{2}}\right) = 8.324 \quad [6]$$

The input signal was processed by the CFR arrangement 200 as shown in FIG. 4 and other arrangements, as described.

Figure 7:
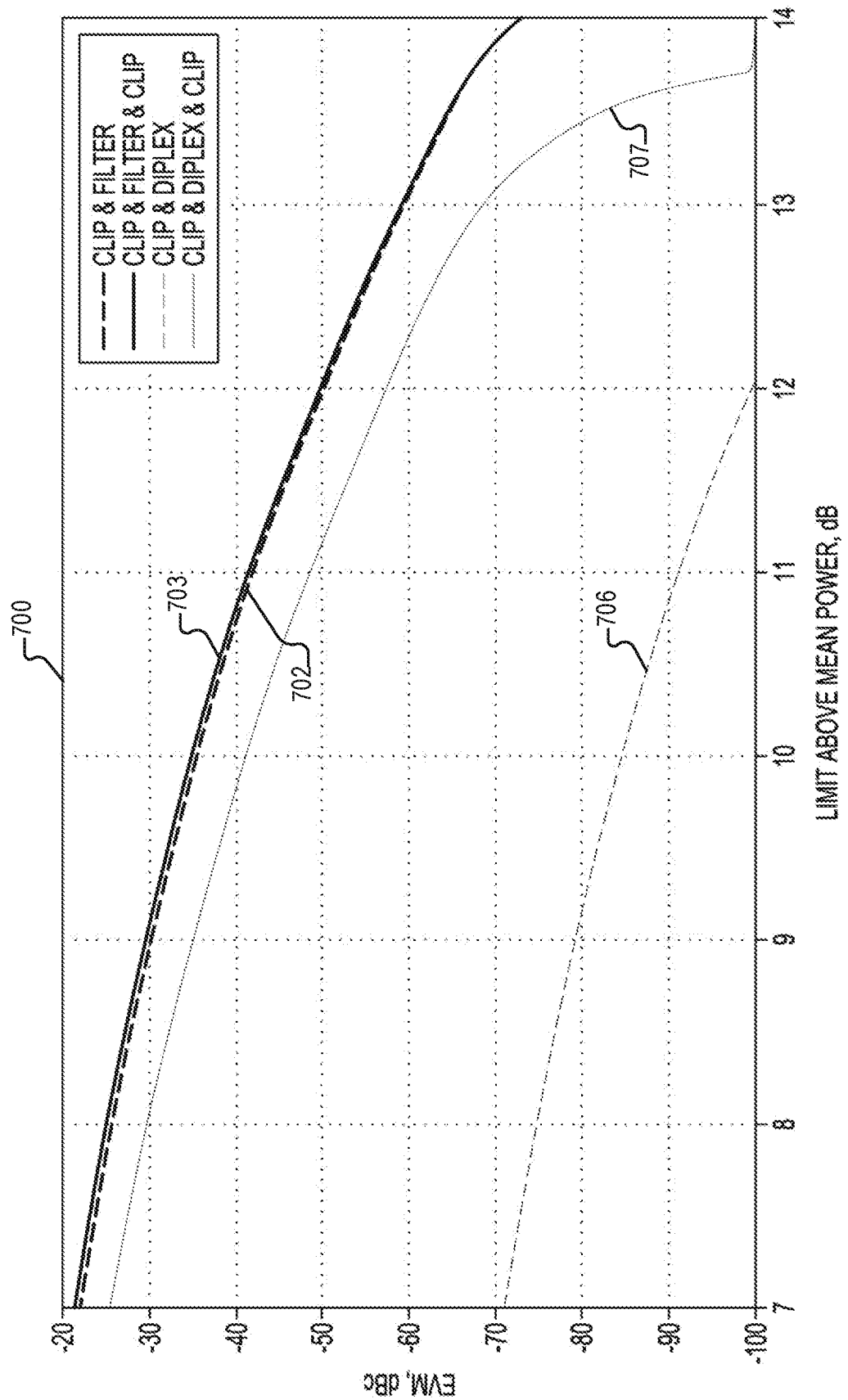
FIG. 7 shows a plot showing Error Vector Magnitude (EVM) resulting from a clip-and-filter CFR arrangement and a diplex CFR arrangement.

FIG. 7 shows a plot 700 showing EVM resulting from a clip-and-filter CFR arrangement and a diplex CFR arrangement, as shown in the arrangement 200 depicted in FIG. 4. EVM is a measure of distortion in a digital transmitter or receiver. For example, EVM describes the root mean square magnitude of a vector representing a difference between the actual signal transmitted or received and the ideal signal relative to the root mean square of the ideal signal. In the example of FIG. 7, the EVM is measured from 1.76% to 32.5% of the sample rate. The selected range for measuring EVM corresponds to a common allocation for cable television applications, although other allocation ranges may be measured and/or used in various applications. In the plot 700, the vertical axis indicates the relative EVM of a transmitted signal. The EVM is indicated in dBc or decibels relative to the ideal carrier. Four curves are shown in FIG. 7. The horizontal axis indicates the limit of clipping above mean power, in decibels.

A first curve 702 shows the EVM for a clip-and-filter arrangement where the input signal is clipped and subsequently filtered. A second curve 703 shows the clip-and-filter arrangement depicted by the curve 702 with an additional clipping performed. Curve 704 shows EVM for a diplex CFR arrangement, such as the diplex CFR arrangement 200 shown in FIG. 4. Curve 707 shows a result for a diplex CFR arrangement, such as the arrangement 200 shown in FIG. 4, with an additional clipping performed, for example, by an additional clipping block positioned to receive the output of the multiplexer 208.

It can be seen that the EVM for the diplex CFR (curve 706) is lower than that of the clip-and-filter arrangement both with additional clipping (curve 703) and without additional clipping (curve 702). As shown for the average power 10.5 dB below the hard limit at FIG. 9, the diplex CFR arrangement 200 shifts clipping energy away from the band of the input signal. Also, FIG. 7 shows that the performance of an arrangement that adds additional clipping to the diplex CFR arrangement (curve 707) still demonstrates a lower CFR than the clip-and-filter arrangement (curves 703, 702).

Figure 8:
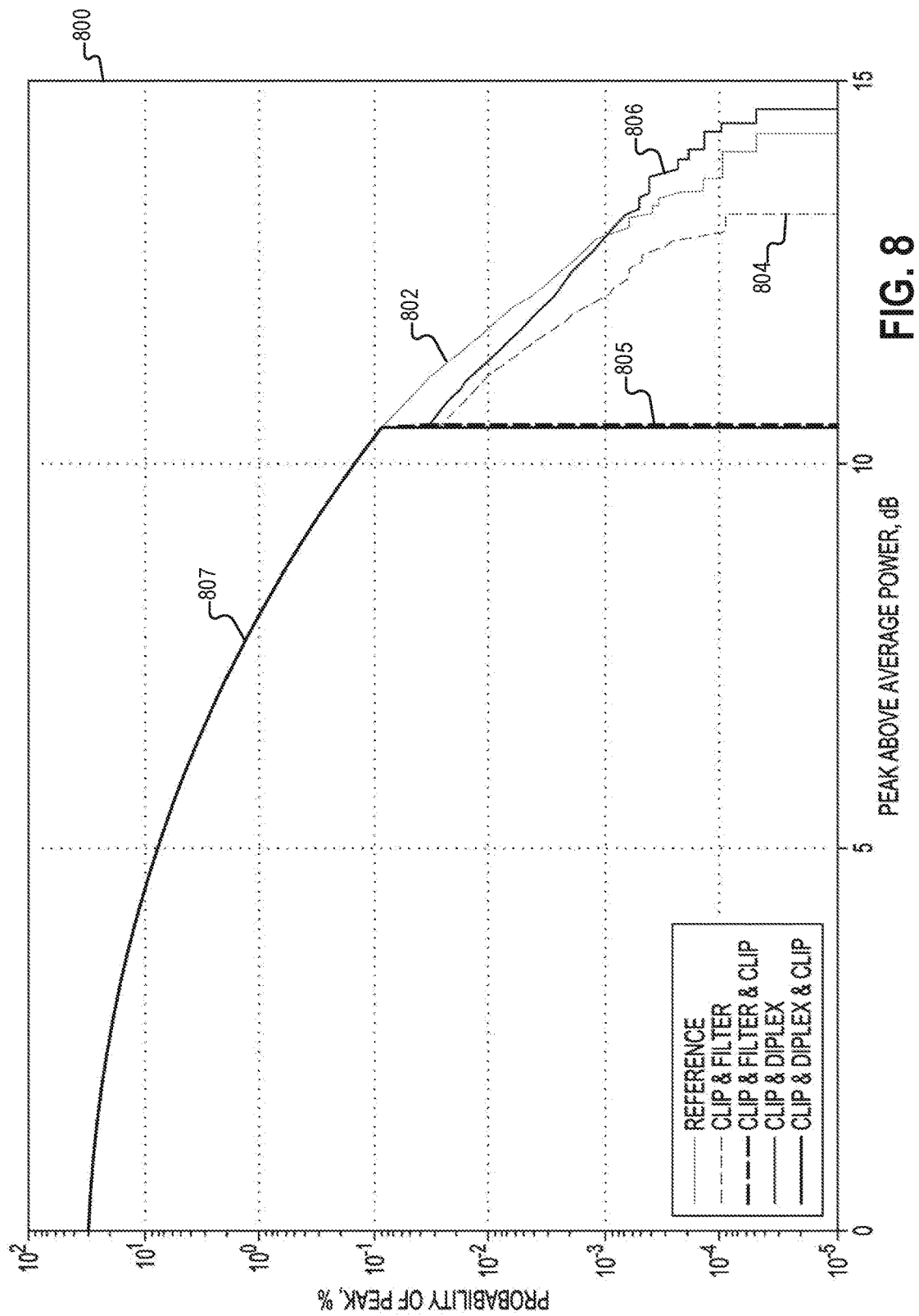
FIG. 8 is a plot showing a Complementary Cumulative Density Function (cCDF) of a clip-and-filter CFR arrangement and a diplex CFR arrangement.

FIG. 8 is a plot 800 showing a Complementary Cumulative Density Function (cCDF) of a clip-and-filter CFR arrangement and a diplex CFR arrangement. A reference curve 802 describes a half band filter, such as the HBF 201, configured to allow the output to grow past full scale without overflow. In this example, with the signal mean set to about −10.5 dBFS, less than about 0.09% of the samples exceed full scale. Curve 804 describes a clip-and-filter arrangement. As illustrated, less than half of the clipped samples show regrowth. Curve 806 a diplex CFR arrangement, as described herein. As shown, the diplex CFR arrangement (curve 806) exhibits slightly higher peak regrowth than the clip-and-filter arrangement (curve 804).

Curve 805 describes a clip-and-filter arrangement with an additional clip performed after filleting. Curve 807 describes a diplex CFR arrangement, as described herein, with an additional clip performed after the diplex CFR arrangement. In both cases, spectral regrowth above the 10.5 dB hard limit of the clip is attenuated. As shown in FIG. 7, however, the additional clip may cause additional spectral regrowth and other distortion.

Figure 9:
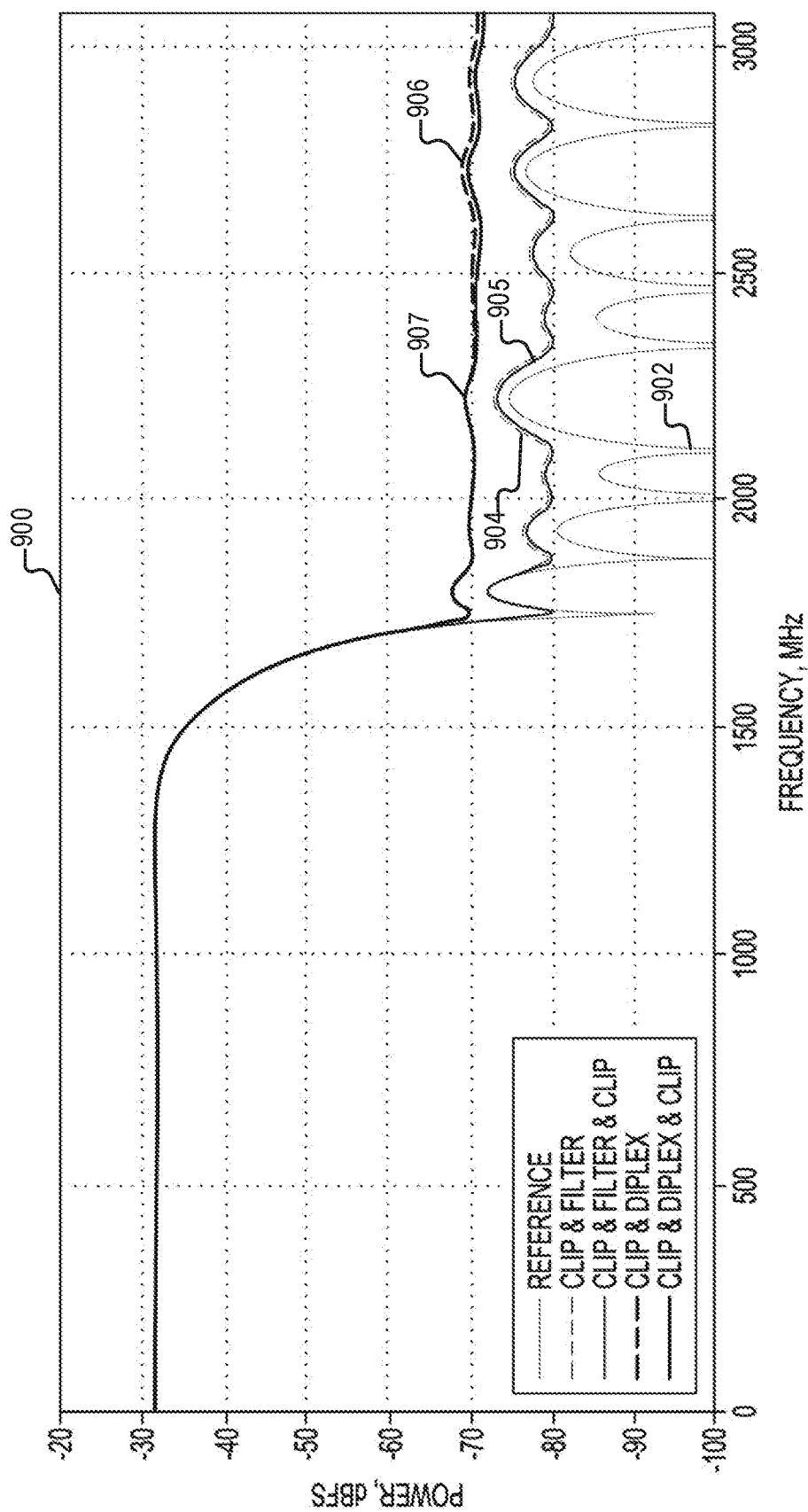
FIG. 9 is a plot comparing the spectral densities of signals processed by a clip-and-filter CFR arrangement and a diplex CFR arrangement.

FIG. 9 is a plot 900 comparing the spectral densities of signals processed by a clip-and-filter CFR arrangement and a diplex CFR arrangement. A reference curve 902 shows the output of a half band filter, such as the HBF 201, configured to allow the output to grow past full scale without overflow. Curve 904 shows the spectral density of the output of a clip-and-filter CFR arrangement. Curve 905 shows the spectral density of the output of a clip-and-filter CFR arrangement with an additional clip performed after filtering. For curves 904 and 905, the spectral density at higher frequencies (e.g., above 1.7 GHz) is higher than that of the reference signal, indicating that the clip-and-filter CFR arrangement pushes some of the distortion due to clipping out-of-band.

The curve 906 shows the spectral density of the output of a diplex CFR arrangement, such as the arrangement 200 shown in FIG. 4. The curve 907 shows the spectral density of the output of a diplex CFR arrangement, such as the arrangement 200 of FIG. 4, with an additional clip performed, for example, to the output of the multiplexer 208. For both curves, 906, 907, the out-of-band spectral density is about 3 to 10 dB higher than that shown by curve 904. This indicates that the diplex CFR described herein pushes a larger portion of the distortion due to clipping out-of-band (e.g., in this example, above about 1.7 GHz). Accordingly, viewing FIGS. 7 and 9 together, the diplex CFR arrangements described herein may provide better EVM performance than similarly low cost clip-and-filter arrangements at the cost of generating more out-of-band noise. In cable arrangements, where higher frequency, out-of-band portions of the medium are not used and typically owned by the same party transmitting the in-band signal, this trade off may be advantageous. In other arrangements, such as wireless arrangements, where out-of-band noise can affect adjacent hands, the out-of-band noise generated by a diplex CFR can be mitigated with an appropriate baseband or RF filter.

Figure 10:
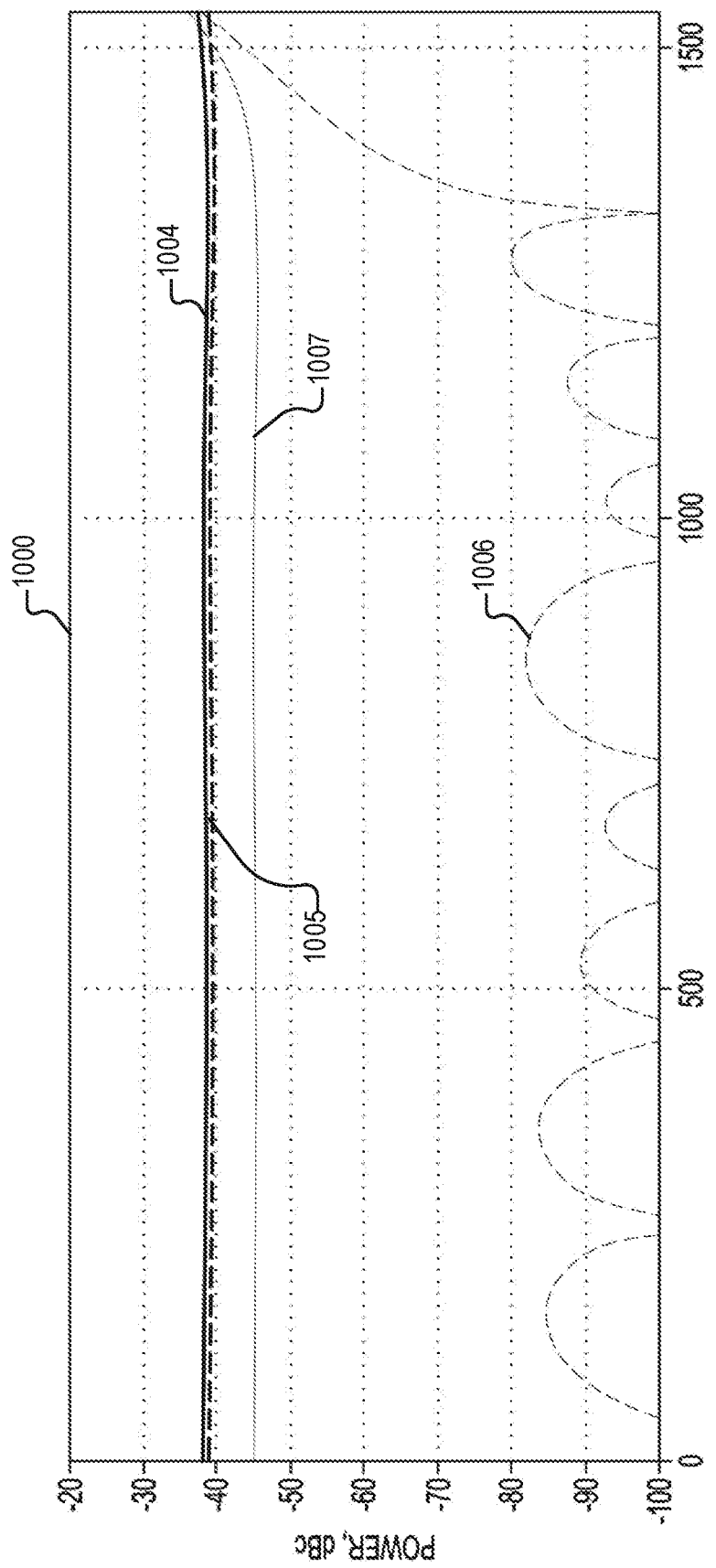
FIG. 10 is a plot comparing the EVM by frequency of a diplex CFR arrangement and a clip-and-filter arrangement.

FIG. 10 is a plot 1000 comparing the EVM by frequency of a diplex CFR arrangement and a clip-and-filter arrangement. The plot 1000 also includes intermediate curves 1004 and 1005 showing the EVM by frequency of output of a half band filter, such as the HBF 201, configured to allow the output to grow past full scale without overflow. Curve 1004 shows the EVM by frequency of a clip-and-filter arrangement. Curve 1005 shows the EVM by frequency of a clip-and filter arrangement followed by an additional clip. As shown, the additional clip (curve 1004) causes only a small increase in EVM as compared the clip-and-filter arrangement without the additional clip (curve 1004). Curve 1006 shows EVM by frequency of a diplex CFR arrangement, such as the arrangement 200 as illustrated in FIG. 4. The curve 1007 shows EVM by frequency of a diplex CFR arrangement, such as the arrangement 200 of FIG. 4, with an additional clip performed, for example, to the output of the multiplexer 208. The EVM described by curve 1006 is proportional to the rejection of the HBF 201 which can be enhanced or diminished arbitrarily. As shown by the curves 1006 and 1004, the EVM by frequency of the diplex CGR arrangement is lower than that of the clip-and-filter-and-clip arrangement by about 7 dB below about 1.25 GHz.

Figure 11:
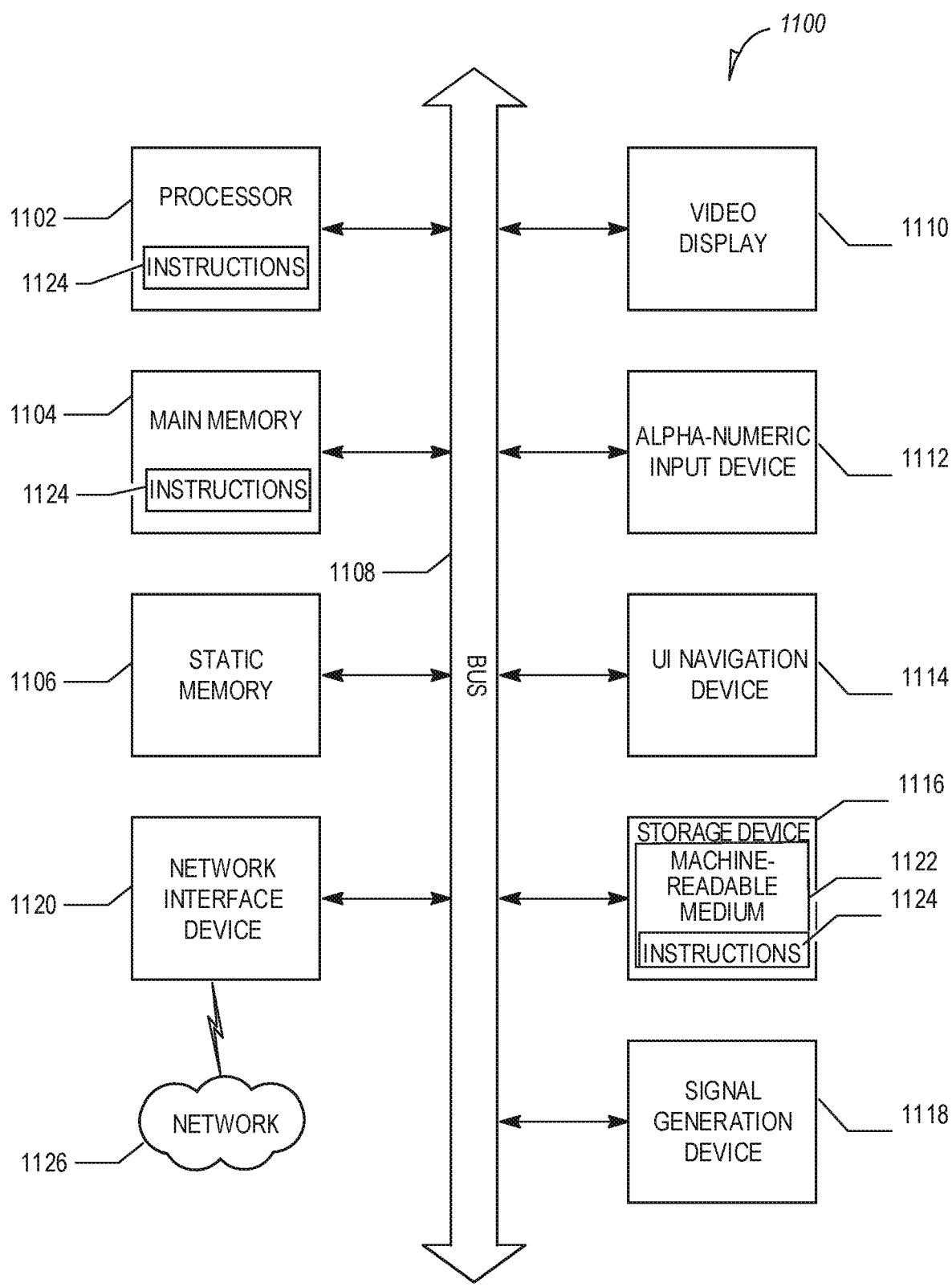
FIG. 11 is a block diagram illustrating a computing device hardware architecture within which a set or sequence of instructions can be executed to cause a machine to perform examples of any one of the methodologies discussed herein.

FIG. 11 is a block diagram illustrating a computing device hardware architecture 1100, within which a set or sequence of instructions can be executed to cause a machine to perform examples of any one of the methodologies discussed herein. The architecture 1100 may describe, for example, any of the computing devices described herein. The architecture 1100 may operate as a standalone device or may be connected (e.g., networked) to other machines. In a networked deployment, the architecture 1100 may operate in the capacity of either a server or a client machine in server-client network environments, or it may act as a peer machine in peer-to-peer (or distributed) network environments. The architecture 1100 can be implemented in a personal computer (PC), a tablet PC, a hybrid tablet, a set-top box (STB), a personal digital assistant (PDA), a mobile telephone, a web appliance, a network router, a network switch, a network bridge, or any machine capable of executing instructions (sequential or otherwise) that specify operations to be taken by that machine.

The example architecture 1100 includes a processor unit 1102 comprising at least one processor (e.g., a central processing unit (CPU), a graphics processing unit (GPU), or both, processor cores, compute nodes, etc.). The architecture 1100 may further comprise a main memory 1104 and a static memory 1106, which communicate with each other via a link 1108 (e.g., bus). The architecture 1100 can further include a video display unit 1110, an alphanumeric input device 1112 (e.g., a keyboard), and a UI navigation device 1114 (e.g., a mouse). In some examples, the video display unit 1110, alphanumeric input device 1112, and UI navigation device 1114 are incorporated into a touchscreen display. The architecture 1100 may additionally include a storage device 1116 (e.g., a drive unit), a signal generation device 1118 (e.g., a speaker), a network interface device 1120, and one or more sensors (not shown), such as a GPS sensor, compass, accelerometer, or other sensor.

In some examples, the processor unit 1102 or another suitable hardware component may support a hardware interrupt. In response to a hardware interrupt, the processor unit 1102 may pause its processing and execute an ISR, for example, as described herein.

The storage device 1116 includes a machine-readable medium 1122 on which is stored one or more sets of data structures and instructions 1124 (e.g., software) embodying or utilized by any one or more of the methodologies or functions described herein. The instructions 1124 can also reside, completely or at least partially, within the main memory 1104, within the static memory 1106, and/or within the processor unit 1102 during execution thereof by the architecture 1100, with the main memory 1104, the static memory 1106, and the processor unit 1102 also constituting machine-readable media. The instructions 1124 stored at the machine-readable medium 1122 may include, for example, instructions for implementing the software architecture 802, instructions for executing any of the features described herein, etc.

While the machine-readable medium 1122 is illustrated in an example to be a single medium, the term "machine-readable medium" can include a single medium or multiple media (e.g., a centralized or distributed database, and/or associated caches and servers) that store the one or more instructions 1124. The term "machine-readable medium" shall also be taken to include any tangible medium that is capable of storing, encoding, or carrying instructions for execution by the machine and that cause the machine to perform any one or more of the methodologies of the present disclosure, or that is capable of storing, encoding, or carrying data structures utilized by or associated with such instructions. The term "machine-readable medium" shall accordingly be taken to include, but not be limited to, solid-state memories, and optical and magnetic media. Specific examples of machine-readable media include non-volatile memory, including, but not limited to, by way of example, semiconductor memory devices (e.g., electrically programmable read-only memory (EPROM) and electrically erasable programmable read-only memory (EEPROM)) and flash memory devices; magnetic disks such as internal hard disks and removable disks; magneto-optical disks; and CD-ROM and DVD-ROM disks.

The instructions 1124 can further be transmitted or received over a communications network 1126 using a transmission medium via the network interface device 1120 utilizing any one of a number of well-known transfer protocols (e.g., hypertext transfer protocol (HTTP)). Examples of communication networks include a LAN, a WAN, the Internet, mobile telephone networks, plain old telephone service (POTS) networks, and wireless data networks (e.g., Wi-Fi, 3G, and 5G LTE/LTE-A or WiMAX networks). The term "transmission medium" shall be taken to include any intangible medium that is capable of storing, encoding, or carrying instructions for execution by the machine, and includes digital or analog communications signals or other intangible media to facilitate communication of such software.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." in this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

The term "circuit" can include a dedicated hardware circuit, a general-purpose microprocessor, digital signal processor, or other processor circuit, and may be structurally configured from a general purpose circuit to a specialized circuit such as using firmware or software.

Any one or more of the techniques (e.g., methodologies) discussed herein may be performed on a machine. In various embodiments, the machine may operate as a standalone device or may be connected (e.g., networked) to other machines. In a networked deployment, the machine may operate in the capacity of a server machine, a client machine, or both in server-client network environments. In an example, the machine may act as a peer machine in peer-to-peer (P2P) (or other distributed) network environment. The machine may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuit sets are a collection of circuits implemented in tangible entities that include hardware (e.g., simple circuits, gates, logic, etc.). Circuit set membership may be flexible over time and underlying hardware variability. Circuit sets include members that may, alone or in combination, perform specified operations when operating. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions can enable embedded hardware (e.g., the execution units or a loading mechanism) to create members of the circuit set in hardware via the variable connections to carry out portions of the specific operation when in operation. Accordingly, the computer readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

Particular implementations of the systems and methods described herein may involve use of a machine (e.g., computer system) that may include a hardware processor (e.g., a central processing unit (CPU), a graphics processing unit (GPU), a hardware processor core, or any combination thereof), a main memory and a static memory, some or all of which may communicate with each other via an interlink (e.g., bus). The machine may further include a display unit, an alphanumeric input device (e.g., a keyboard), and a user interface (UI) navigation device (e.g., a mouse). In an example, the display unit, input device and UI navigation device may be a touch screen display. The machine may additionally include a storage device (e.g., drive unit), a signal generation device (e.g., a speaker), a network interface device, and one or more sensors, such as a global positioning system (GPS) sensor, compass, accelerometer, or other sensor. The machine may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device may include a machine readable medium on which is stored one or more sets of data structures or instructions (e.g., software) embodying or utilized by any one or more of the techniques or functions described herein. The instructions may also reside, completely or at least partially, within the main memory, within static memory, or within the hardware processor during execution thereof by the machine. In an example, one or any combination of the hardware processor, the main memory, the static memory, or the storage device may constitute machine readable media.

While the machine readable medium can include a single medium, the term "machine readable medium" may include a single medium or multiple media (e.g., a centralized or distributed database, and/or associated caches and servers) configured to store the one or more instructions.

The term "machine readable medium" may include any medium that is capable of storing, encoding, or carrying instructions for execution by the machine and that cause the machine to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions may further be transmitted or received over a communications network using a transmission medium via the network interface device utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old. Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device may include one or more physical jacks (e.g., Ethernet, coaxial, or phone jacks) or one or more antennas to connect to the communications network. In an example, the network interface device may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine, and includes digital or analog communications signals or other intangible medium to facilitate communication of such software.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A crest factor reduction (CFR) circuit to provide an interleaved output based at least in part on an input signal, the CFR circuit comprising:
    a first digital interpolation filter configured to provide a first digital filter output based at least in part on a summed signal formed using the input signal and a negated clipped input signal;
    a second digital filter configured to provide a second digital filter output based at least in part on a clipped input signal; and
    a multiplexer configured to receive the first digital filter output and the second digital filter output and generate an output signal, wherein samples of the output signal are alternatingly selected from the first digital filter output and from the second digital filter output.

2. The CFR circuit of claim 1, wherein the second digital filter comprises a center delay circuit.

3. The CFR circuit of claim 1, further comprising a clipping circuit to generate the clipped input signal based at least in part on the input signal.

4. The CFR circuit of claim 1, further comprising a scaler circuit configured to generate a scaled input signal.

5. The CFR circuit of claim 4, further comprising a negator circuit configured to receive the clipped input signal and generate the negated clipped input signal.

6. The CFR circuit of claim 4, further comprising a summer circuit configured to generate the summed signal based at least in part on a sum of the negated clipped input signal and the scaled input signal, wherein the summed signal is provided to the first digital interpolation filter.

7. A method for providing crest factor reduction (CFR) to an input signal, comprising:
    executing a first digital interpolation filter that generates a first filter output signal based at least in part on a summed signal formed using the input signal and a negated clipped input signal;
    executing a second digital filter that generates a second filter output signal based at least in part on a clipped input signal; and
    interleaving the first filter output signal and the second filter output signal to generate a reduced crest factor output signal.

8. The method of claim 7, wherein executing the second digital filter comprises executing a center delay.

9. The method of claim 7, further comprising scaling the input signal to generate a scaled input signal.

10. The method of claim 7, further comprising generating the clipped input signal based at least in part on the input signal.

11. The method of claim 7, further comprising negating the clipped input signal to generate the negated clipped input signal.

12. The method of claim 9, further comprising generating the summed signal based at least in part on a sum of the negated clipped input signal and the scaled input signal, wherein the summed signal is provided to the first digital interpolation filter.

13. The method of claim 7, wherein executing the first digital interpolation filter comprises interpolating the summed signal to increase a sample rate of the summed signal.

14. A system for performing crest factor reduction (CFR), the system comprising:
  means for executing a first digital filter that generates a first filter output signal based at least in part on a summed signal formed using an input signal and a negated clipped input signal;
  means for executing a second digital filter that generates a second filter output signal based at least in part on a clipped input signal; and
  means for interleaving the first filter output signal and the second filter output signal to generate a reduced crest factor output signal.

15. The system of claim 14, wherein the means for executing the second digital filter comprises a center delay circuit.

16. The system of claim 14, further comprising means for scaling the input signal to generate a scaled input signal.

17. The system of claim 16, further comprising means for generating the summed signal based at least in part on a sum of the negated clipped input signal and the scaled input signal, wherein the summed signal is provided to the first digital filter.

18. The system of claim 14, wherein executing the first digital filter comprises interpolating the summed signal to increase a sample rate of the summed signal.

* * * * *